United States Patent
Pradeep et al.

(10) Patent No.: US 6,468,877 B1
(45) Date of Patent: Oct. 22, 2002

(54) METHOD TO FORM AN AIR-GAP UNDER THE EDGES OF A GATE ELECTRODE BY USING DISPOSABLE SPACER/LINER

(75) Inventors: Yelehanka Ramachandramurthy Pradeep; Jia Zhen Zheng, both of Singapore (SG); Lap Chan, SF, CA (US); Elgin Quek, Singapore (SG); Ravi Sundaresan, San Jose, CA (US); Yang Pan; James Yong Meng Lee, both of Singapore (SG); Ying Keung Leung, Hong Kong (HK)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/907,651

(22) Filed: Jul. 19, 2001

(51) Int. Cl.[7] ................. H01L 21/76; H01L 21/336; H01L 21/3205; H01L 21/4763
(52) U.S. Cl. ................. 438/421; 438/585; 438/289; 438/595
(58) Field of Search ................. 438/585, 592, 438/305, 291, 595, 299, 289, 586, 421

(56) References Cited

U.S. PATENT DOCUMENTS

| | | | |
|---|---|---|---|
| 5,770,507 A | | 6/1998 | Chen et al. .............. 438/305 |
| 5,864,160 A | | 1/1999 | Buynoski .............. 257/339 |
| 5,869,374 A | * | 2/1999 | Wu .............. 438/592 |
| 5,915,182 A | * | 6/1999 | Wu .............. 438/595 |
| 5,972,761 A | * | 10/1999 | Wu .............. 438/595 |
| 5,972,763 A | | 10/1999 | Chou et al. .............. 438/305 |
| 5,998,288 A | | 12/1999 | Gardner et al. .............. 438/589 |
| 6,001,695 A | * | 12/1999 | Wu .............. 438/595 |
| 6,015,746 A | | 1/2000 | Yeh et al. .............. 438/421 |
| 6,124,177 A | * | 9/2000 | Lin et al. .............. 438/421 |
| 6,127,712 A | * | 10/2000 | Wu .............. 438/287 |
| 6,180,988 B1 | * | 1/2001 | Wu .............. 438/303 |

* cited by examiner

Primary Examiner—John F. Niebling
Assistant Examiner—Walter L. Lindsay, Jr.
(74) Attorney, Agent, or Firm—George O. Saile; Rosemary L. S. Pike; Stephen G. Stanton

(57) ABSTRACT

A method of fabricating an air-gap spacer of a semiconductor device, comprising the following steps. A semiconductor substrate having at least a pair of STIs defining an active region is provided. A gate electrode is formed on the substrate within the active region. The gate electrode having an underlying gate dielectric layer. A liner oxide layer is formed over the structure, covering the sidewalls of the gate dielectric layer, the gate electrode, and over the top surface of the gate electrode. A liner nitride layer is formed over the liner oxide layer. A thick oxide layer is formed over the structure. The thick oxide, liner nitride, and liner oxide layers are planarized level with the top surface of the gate electrode, and exposing the liner oxide layer at either side of the gate electrode. The planarized thick oxide layer is removed with a portion of the liner oxide layer and a portion of the gate dielectric layer under the gate electrode to form a cross-section inverted T-shaped opening on either side of the gate electrode. A gate spacer oxide layer is formed over the structure at least as thick as the gate electrode, wherein the gate spacer oxide layer partially fills the inverted T-shaped opening from the top down and wherein air gap spacers are formed proximate the bottom of the inverted T-shaped opening. The gate spacer oxide, liner nitride, and liner oxide layers are etched to form gate spacers proximate the gate electrode. The gate spacers having an underlying etched liner nitride layer and liner oxide layer.

21 Claims, 4 Drawing Sheets

METHOD TO FORM AN AIR-GAP UNDER THE EDGES OF A GATE ELECTRODE BY USING DISPOSABLE SPACER/LINER

BACKGROUND OF THE INVENTION

Current gate electrodes suffer from undesirable parasitic overlap capacitance at the gate edge.

U.S. Pat. No. 5,998,288 to Gardner et al. describes an etch back of an oxide spacer 22 that does not continue the etch back to the gate dielectric layer.

U.S. Pat. No. 5,864,160 to Buynoski describes a gate with an air gap on one side and a sealing step.

U.S. Pat. No. 6,015,746 to Yeh et al. describes an air gap on the sides of a gate.

U.S. Pat. No. 5,770,507 to Chen et al. describes an air gap on the side of a gate.

U.S. Pat. No. 5,972,763 to Chou et al. describes formation of an air gap spacer of a metal-oxide semiconductor device.

SUMMARY OF THE INVENTION

Accordingly, it is an object of the present invention to provide a method of forming an air-gap under the edges of a gate electrode.

Another object of the present invention is to provide a method of reducing parasitic overlap capacitance at the gate electrode edge.

A further object of the present invention to provide a method of forming an air-gap under the edges of a gate electrode to reduce parasitic overlap capacitance at the gate edge.

Yet another object of the present invention is to provide a method of forming an air-gap under the edges of a gate electrode to reduce parasitic overlap capacitance at the gate edge by using conventional processes.

Another object of the present invention to provide a method of forming an air-gap under the edges of a gate electrode without adversely affecting the isolation oxide.

Other objects will appear hereinafter.

It has now been discovered that the above and other objects of the present invention may be accomplished in the following manner. Specifically, a semiconductor substrate having at least a pair of STIs defining an active region is provided. A gate electrode is formed on the substrate within the active region. The gate electrode having an underlying gate dielectric layer. A liner oxide layer is formed over the structure, covering the sidewalls of the gate dielectric layer, the gate electrode, and over the top surface of the gate electrode. A liner nitride layer is formed over the liner oxide layer. A thick oxide layer is formed over the structure. The thick oxide, liner nitride, and liner oxide layers are planarized level with the top surface of the gate electrode, and exposing the liner oxide layer at either side of the gate electrode. The planarized thick oxide layer is removed with a portion of the liner oxide layer and a portion of the gate dielectric layer under the gate electrode to form a cross-section inverted T-shaped opening on either side of the gate electrode. A gate spacer oxide layer is formed over the structure at least as thick as the gate electrode, wherein the gate spacer oxide layer partially fills the inverted T-shaped opening from the top down and wherein air gap spacers are formed proximate the bottom of the inverted T-shaped opening. The gate spacer oxide, liner nitride, and liner oxide layers are etched to form gate spacers proximate the gate electrode. The gate spacers having an underlying etched liner nitride layer and liner oxide layer.

BRIEF DESCRIPTION OF THE DRAWINGS

The features and advantages of the method of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, etc. may be formed or accomplished by conventional methods known in the prior art.

The present invention reduces the parasitic overlap capacitance at the gate edge by forming an air gap proximate the gate edge. The process of the present invention can be performed using conventional processes and the use of a wet chemical etch. The process of the present invention will not adversely affect the isolation oxide due to an overlying layer of protective nitride.

Formation of STIs

Figure 1:
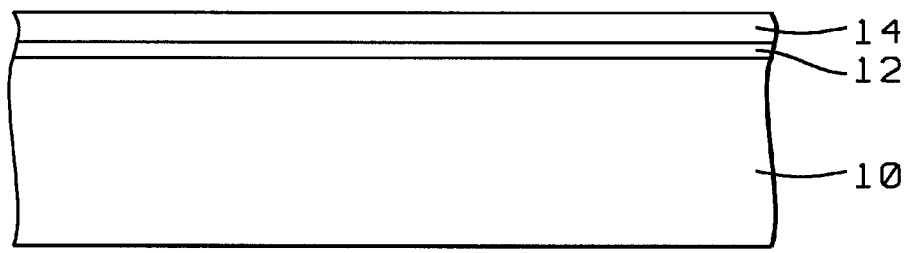
FIGS. 1–10 schematically illustrates the preferred embodiment of the present invention, with FIGS. 6–10 an enlarged view of a portion of the structure illustrated in FIGS. 1–5.

Accordingly, as shown in FIG. 1, pad silicon oxide (pad oxide) layer 12 is formed over semiconductor substrate 10. Semiconductor substrate 10 is preferably formed of silicon.

Nitride layer 14 is formed over pad oxide layer 12. Nitride layer 14 may be formed of silicon oxynitride (SiON), or silicon nitride (SiN) and SiON.

Figure 2:
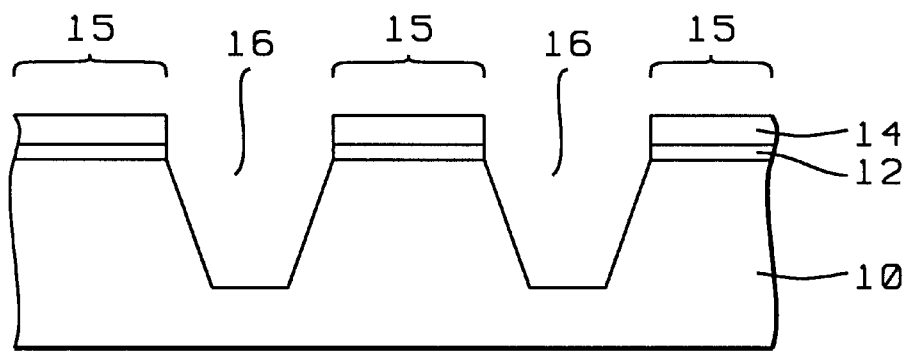

As shown in FIG. 2, the structure is masked and etched to form shallow trench isolation (STI) trenches 16 defining at least one active area 15. The structure may be masked by, for example, forming a layer of patterned photoresist over nitride layer 14.

STI material is deposited over the structure, filling STI trenches 16. STI material may be a material formed by either a HDP (high density plasma)-$SiO_2$, TEOS-LPCVD (low pressure chemical vapor deposition), or $O_3$ and TEOS (APCVD) (atmospheric pressure CVD) process. STI material is preferably HDP-$SiO_2$.

Figure 3:
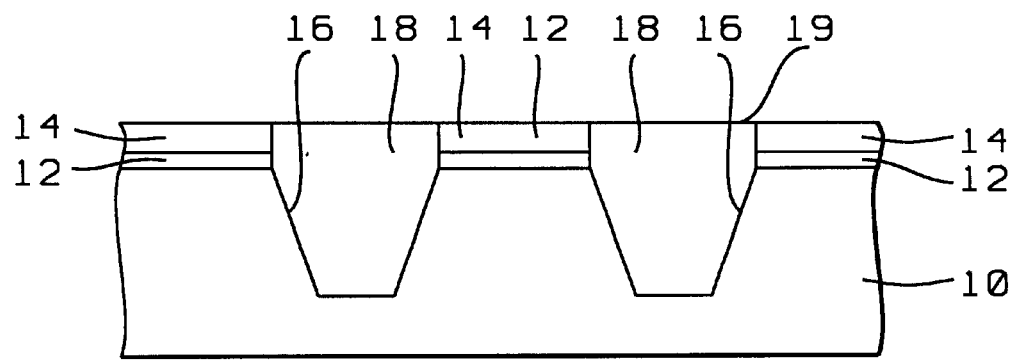

As shown in FIG. 3, the STI material is then planarized, preferably by chemical mechanical polishing (CMP), to form STIs 18 having an essentially planar surface 19.

Formation of Gate Electrodes

Figure 4:
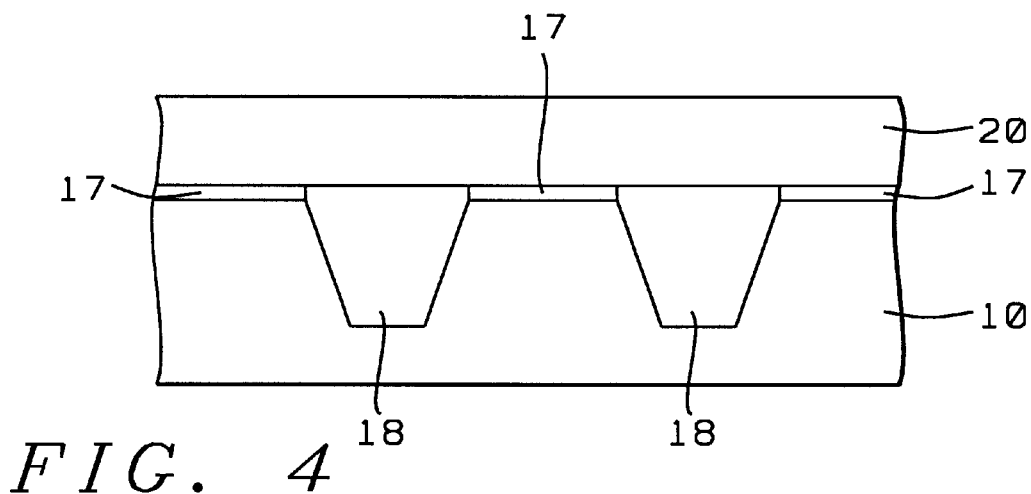

As shown in FIG. 4, nitride layer 14 is removed, preferably by a hot phosphoric acid treatment at a temperature from about 150 to 200° C.

Pad oxide layer 12 is then removed, preferably by dilute HF acid, vapor HF or buffered oxide etchants (BOE).

Gate dielectric layer 17 is then selectively grown/deposited over the exposed semiconductor substrate 10 to a thickness of from about 10 to 75 Å and more preferably from about 14 to 20 Å. Gate dielectric layer 17 may be formed of $SiO_2$, $Ta_2O_5$, SiN, SiON, $SiO_2$+SiN, SiN+$SiO_2$, $HFO_2$, or $ZrO_2$.

Gate electrode layer 20 is then formed over gate dielectric layer 17 and STIs 18. Gate electrode layer 20 may be formed of polysilicon, polycide using $WSi_x$, $TiSi_x$, $CoSi_x$ or $NiSi_x$, for example, amorphous silicon, or a bi-layer structure having a lower layer of one the aforementioned materials with an overlying polycide layer, and is preferably formed of amorphous silicon. Gate electrode can include a metal gate such as W/TaN/amorphous silicon, for example.

Figure 5:
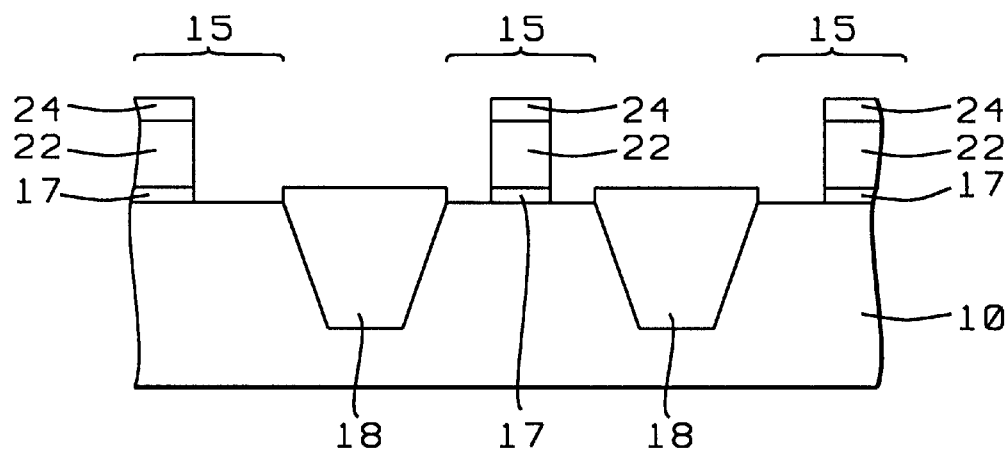

As shown in FIG. 5, patterned hard mask layer 24 is formed over gate electrode layer 20 to a thickness of from about 300 to 1000 Å. Hard mask layer 24 may be formed of $Si_3N_4$ (SiN), $SiO_2$, SiON, $SiO_2$+SiN, or $SiO_2$+SiON, and is preferably SiON.

Gate electrode layer 20 is then etched, using patterned hard mask layer 24 as a mask, to form gate electrodes 22 within active areas 15. A conventional dry plasma etch is preferably used to etch gate electrode layer 20. Gate electrodes 22 are from about 1000 to 3000 Å thick, and more preferably from about 1000 to 2500 Å thick. Gate electrodes 22 are preferably from about 300 to 3500 Å wide, and are more preferably from about 500 to 3500 Å wide.

Etching of gate electrode layer 20 also etches that portion of gate dielectric layer 17 not under gate electrodes 22 leaving etched gate dielectric layers 17.

It is noted that the dashed line box denoted as "FIGS. 6–10" in FIG. 5 illustrate the area that is slightly enlarged in FIGS. 6–10.

Formation of Liner Oxide and Liner Nitride Layers

Figure 6:
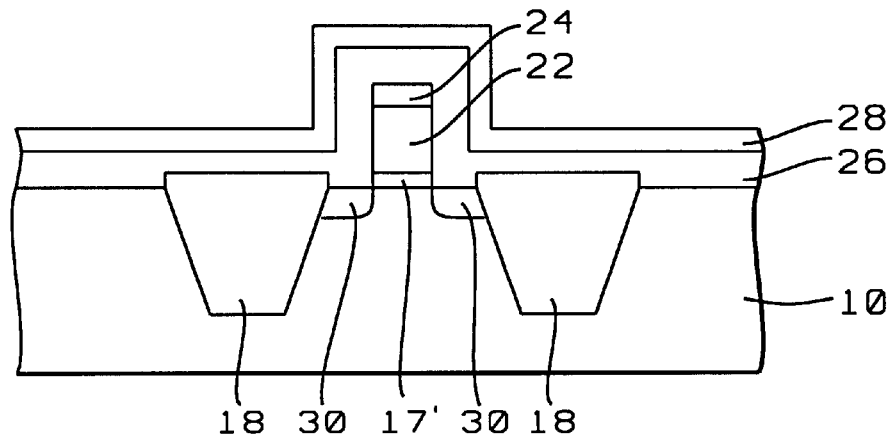

As shown in FIG. 6 (a slightly enlarged portion of dashed box "FIGS. 6–10" of FIG. 5) liner oxide layer 26 is deposited/grown over the structure of FIG. 5 to a thickness of from about 100 to 500 Å, and more preferably from about 100 to 200 Å.

Low doped source and drain (LDD) 30 may then be formed by conventional ion implantation methods. The LDD implant can be performed before or after the liner oxide step.

Liner nitride layer 28 is then formed over liner oxide layer 26 to a thickness of from about 50 to 300 Å, and more preferably from about 50 to 200 Å.

Liner oxide layer 26 and liner nitride layer 28 will be used for STI 18 edge or STI 18 oxide protection, and for gate electrode 22 spacer formation as described below.

Deposition of Thick Oxide Layer and CMP

Figure 7:
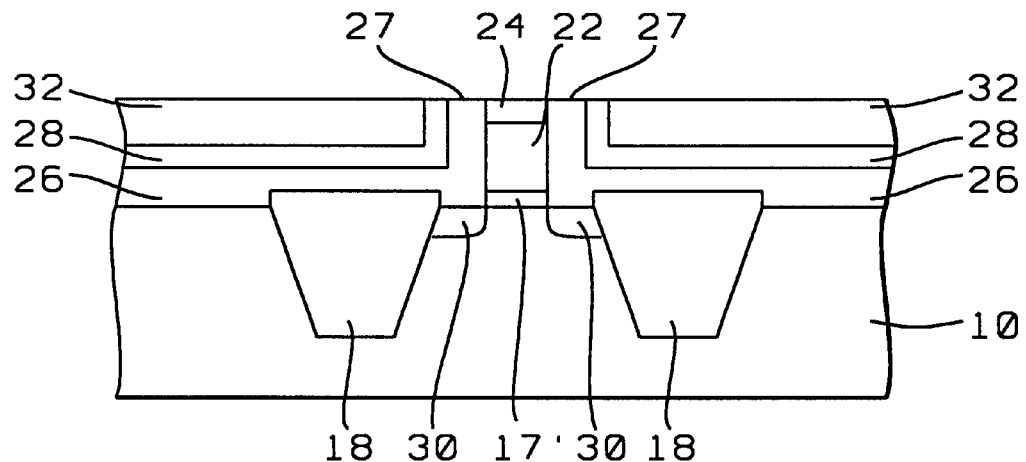

As shown in FIG. 7, thick oxide layer 32 is deposited over the structure of FIG. 6 as least as thick as the protruding gate electrode 22/liner oxide layer 26/liner nitride layer 28 portion.

The structure is then planarized, preferably by CMP, using patterned hard mask 24 over gate electrode 22 as a stop layer. This exposes portions 27 of liner oxide layer 26 adjacent patterned hard mask layer 24.

Oxide Removal

Figure 8:
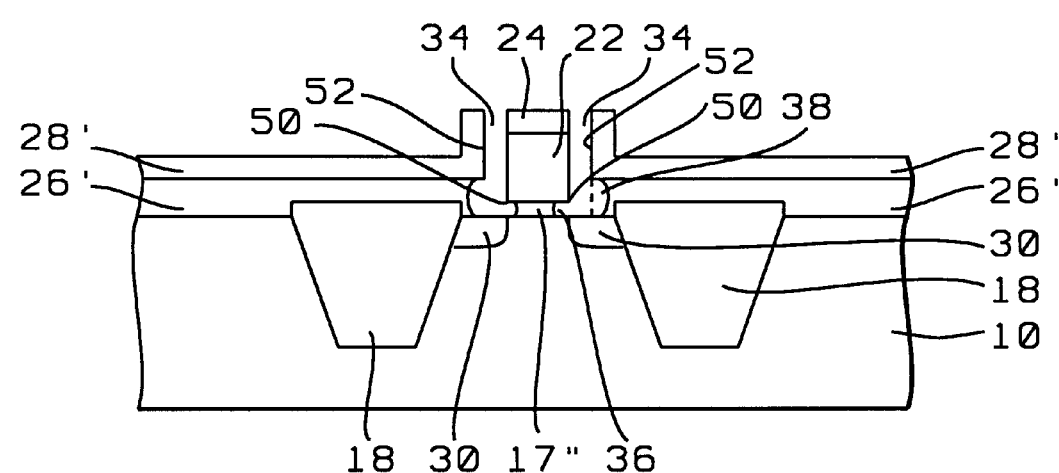

As shown in FIG. 8, preferably using either vapor HF acid or a dilute HF acid solution, planarized thick oxide layer 32 is removed as is a portion of liner oxide layer 26 and a portion of etched gate dielectric layer 17' to form cross-section inverted T-shaped openings 34 adjacent gate electrode 22 and patterned hard mask layer 24. The removal of exposed liner oxide layer 26 is self-limiting due to the narrow gap formed between gate dielectric 22/patterned hard mask layer 24 and liner nitride layer 28.

The removal of exposed liner oxide layer 26 is self-limiting due to the narrow gap formed between gate dielectric 22/patterned hard mask layer 24 and liner nitride layer 28. Etched gate dielectric layer 17' is recessed a distance 36 from about 50 to 300 and more preferably from about 50 to 150 Å from bottom edge 50 of gate electrode 22.

Inverted T-shaped openings 34 also extend a distance 38 from about 100 to 300 and more preferably about 100 to 250 Å from bottom edge 52 of liner nitride layer 28.

It is noted that by forming a mask over one side of exposed portion 27 of liner oxide layer 26 so that only one side of liner oxide layer 26 and the corresponding side of etched gate dielectric layer 17' are removed by the HF treatment.

Deposition of Gate Spacer Oxide Layer

Figure 9:
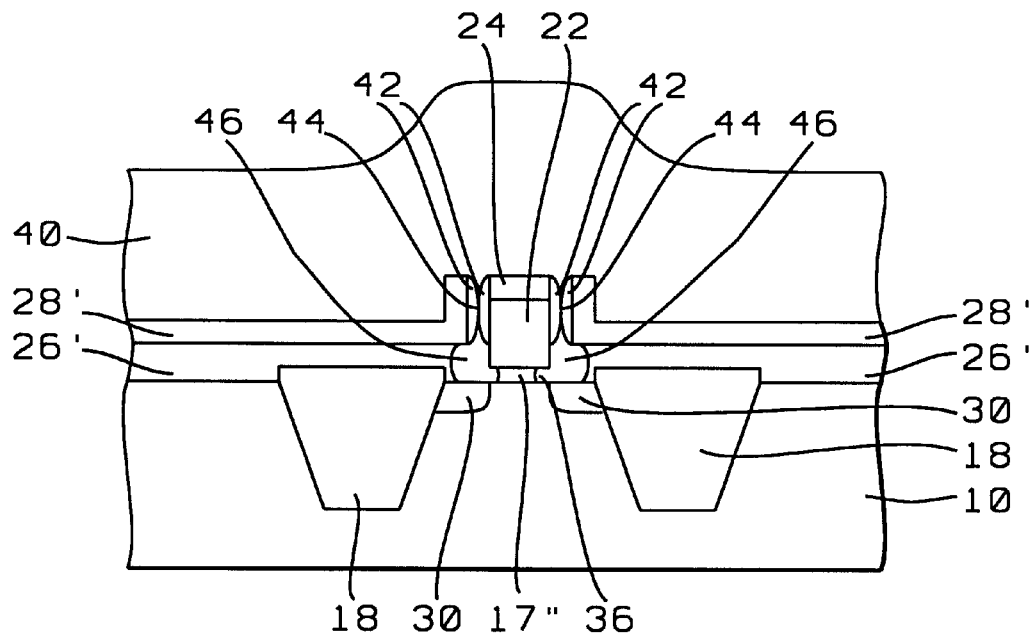

As shown in FIG. 9, gate spacer oxide layer 40 (for gate spacer formation) is deposited over the structure of FIG. 8 to a thickness of from about 300 to 1000 Å, and more preferably from about 300 to 500 Å. The gate spacer oxide layer 40 deposition extends partially into openings 34 at 42 and forms a seal at 44. Because the nature of CVD deposition is to have thicker deposition at corners, it will become self-sealing.

Due to the narrow gap formed between gate dielectric 22/patterned hard mask layer 24 and liner nitride layer 28, gate spacer oxide layer 40 deposition self seals at 44 forming air-gap spacer 46. Air gap spacer 46 reduces parasitic overlap capacitance at the gate edge 50 because air has the lowest dielectric constant.

Formation of Oxide Spacers

Figure 10:
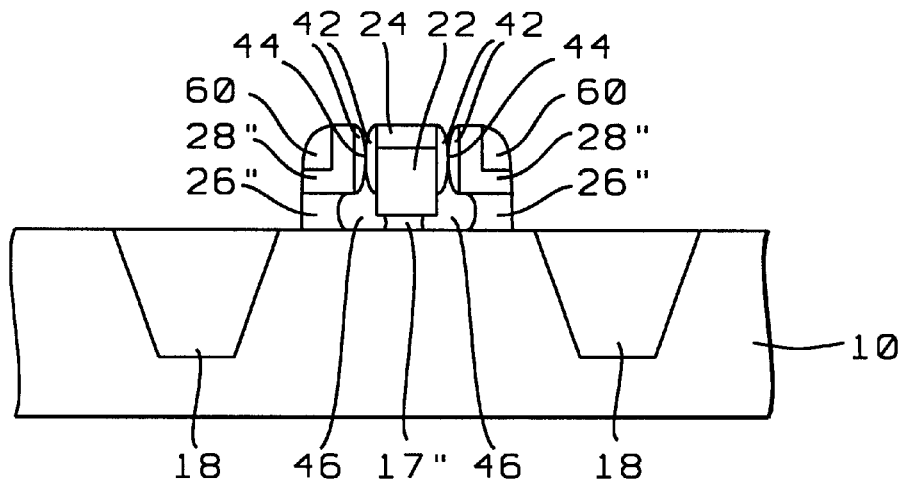

As shown in FIG. 10, gate spacer oxide layer 40, liner nitride layer 28 and liner oxide layer 26 are anisotropically etched to form gate electrode spacers 60.

Conventional build-up processes may then be used to form transistors /semiconductor devices. For example, highly doped source and drain (HDD) implants (not shown) may be made outboard of gate electrode spacers 60.

While particular embodiments of the present invention have been illustrated and described, it is not intended to limit the invention, except as defined by the following claims.

We claim:

1. A method of fabricating an air-gap spacer of a semiconductor device, comprising the steps of:

providing a semiconductor substrate having at least a pair of STIs defining an active region;

forming a gate electrode on said substrate within said active region; said gate electrode having an underlying gate dielectric layer;

forming a liner oxide layer over the structure, covering the sidewalls of said gate dielectric layer, said gate electrode, and over the top surface of said gate electrode;

forming a liner nitride layer over said liner oxide layer;

forming a thick oxide layer over the structure;

planarizing said thick oxide layer, said liner nitride layer, and said liner oxide layer level with said top surface of said gate electrode, and exposing said liner oxide layer at either side of said gate electrode;

removing said planarized thick oxide layer and a portion of said liner oxide layer and a portion of said gate dielectric layer under said gate electrode to form a cross-section inverted T-shaped opening on either side of said gate electrode;

forming a gate spacer oxide layer over the structure at least as thick as said gate electrode, wherein said gate spacer oxide layer partially fills said inverted T-shaped opening from the top down; wherein air gap spacers are formed proximate the bottom of said inverted T-shaped opening; and etching said gate spacer oxide layer, liner nitride layer, and liner oxide layer to form gate spacers proximate said gate electrode; said gate spacers having an underlying etched liner nitride layer and liner oxide layer.

2. The method of claim 1, wherein said gate electrode is from about 1000 to 3000 Å thick, gate dielectric layer is from about 10 to 75 Å thick, said liner oxide layer is from about 100 to 500 Å thick, said liner nitride layer is from about 50 to 300 Å thick; and said gate dielectric layer is removed from about 50 to 300 Å from under said gate electrode.

3. The method of claim 1, wherein said gate electrode is from about 1000 to 2500 Å thick, said gate dielectric layer is from about 14 to 20 Å thick, said liner oxide layer is from about 100 to 200 Å thick, said liner nitride layer is from about 50 to 200 Å thick; and said gate dielectric layer is removed from about 50 to 150 Å from under said gate electrode.

4. The method of claim 1, including the step of forming a patterned hard mask layer over said gate electrode, wherein said hard mask layer is used as a stop layer in said planarization step and said planarized thick oxide layer, liner nitride layer, and liner oxide layer are level with the top surface of said hard mask layer.

5. The method of claim 1, including the step of forming a patterned hard mask layer over said gate electrode, wherein said hard mask layer is comprised of a material selected from the group consisting of $Si_2N_4$, $SiO_2$, SiON, $SiO_2$+SiN, and $SiO_2$+SiON.

6. The method of claim 1, wherein said STIs are comprised of a material selected from the group consisting of HDP-$SiO_2$, TEOS-LPCVD, and $O_3$ and TEOS (APCVD); said gate dielectric layer is comprised of a material selected from the group consisting of $SiO_2$, $Ta_2O_5$, SiN, SiON, $SiO_2$+SiN, SiN+$SiO_2$, $HFO_2$ and $ZrO_2$; and said gate electrode is comprised of a material selected from the group consisting of polysilicon, polycide, amorphous silicon, and a bi-layer structure having a lower layer of one the aforementioned materials with an overlying polycide layer.

7. The method of claim 1, wherein said STIs are comprised of HDP-$SiO_2$; said gate dielectric layer is comprised of a material selected from the group consisting of $SiO_2$, $Ta_2O_5$, SiN, SiON, $SiO_2$+SiN, SiN+$SiO_2$, $HFO_2$ and $ZrO_2$; and said gate electrode is comprised of amorphous silicon.

8. The method of claim 1, further including the steps of:
forming a pad oxide layer over said semiconductor substrate;
forming a nitride layer over said pad oxide layer;
etching said nitride layer, pad oxide layer, and semiconductor substrate to form at least a pair of STI trenches defining said active region; and
forming planarized STIs within said STI trenches;
removing said nitride layer; and
removing said pad oxide layer before formation of said gate electrode within said active region.

9. A method of fabricating an air-gap spacer of a semiconductor device, comprising the steps of:
providing a semiconductor substrate having a pad oxide layer and a nitride layer successively formed on said substrate;
forming at least a pair of STIs through said nitride and pad oxide layers and into said substrate; said STIs defining an active region;
removing said nitride layer and pad oxide layer exposing said substrate at least within said active region;
forming a gate electrode on said exposed substrate within said active region; said gate electrode having an underlying gate dielectric layer;
forming a liner oxide layer over the structure, covering the sidewalls of said gate dielectric layer, said gate electrode, and over the top surface of said gate electrode;
forming a liner nitride layer over said liner oxide layer;
forming a thick oxide layer over the structure;
planarizing said thick oxide layer, said liner nitride layer, and said liner oxide layer level with said top surface of said gate electrode, and exposing said liner oxide layer at either side of said gate electrode;
removing said planarized thick oxide layer and a portion of said liner oxide layer and a portion of said gate dielectric layer under said gate electrode to form a cross-section inverted T-shaped opening on either side of said gate electrode;
forming a gate spacer oxide layer over the structure at least as thick as said gate electrode, wherein said gate spacer oxide layer partially fills said inverted T-shaped opening from the top down; wherein air gap spacers are formed proximate the bottom of said inverted T-shaped opening; and
etching said gate spacer oxide layer, liner nitride layer, and liner oxide layer to form gate spacers proximate said gate electrode; said gate spacers having an underlying etched liner nitride layer and liner oxide layer.

10. The method of claim 9, wherein said; said gate electrode is from about 1000 to 3000 Å thick, gate dielectric layer is from about 10 to 75 Å thick, said liner oxide layer is from about 100 to 500 Å thick, said liner nitride layer is from about 50 to 300 Å thick; and said gate dielectric layer is removed from about 50 to 300 Å from under said gate electrode.

11. The method of claim 9, wherein said gate electrode is from about 1000 to 2500 Å thick, said gate dielectric layer is from about 14 to 20 Å thick, said liner oxide layer is from about 100 to 200 Å thick, said liner nitride layer is from about 50 to 200 Å thick; and said gate dielectric layer is removed from about 50 to 150 Å from under said gate electrode.

12. The method of claim 9, including the step of forming a patterned hard mask layer over said gate electrode, wherein said hard mask layer is used as a stop layer in said planarization step and said planarized thick oxide layer, liner nitride layer, and liner oxide layer are level with the top surface of said hard mask layer.

13. The method of claim 9, including the step of forming a patterned hard mask layer over said gate electrode, wherein said hard mask layer is comprised of a material selected from the group consisting of $Si_2N_4$, $SiO_2$, SiON, $SiO_2$+SiN, and $SiO_2$+SiON.

14. The method of claim 9, wherein said nitride layer is comprised of a material selected from the group consisting of SiON, and SiN+SiON; said STIs are comprised of a material selected from the group consisting of HDP-$SiO_2$, TEOS-LPCVD, and $O_3$ and TEOS (APCVD); said gate dielectric layer is comprised of a material selected from the group consisting of $SiO_2$, $Ta_2O_5$, SiN, SiON, $SiO_2$+SiN, SiN+$SiO_2$, $HFO_2$ and $ZrO_2$; and said gate electrode is comprised of a material selected from the group consisting of polysilicon, polycide, amorphous silicon, and a bi-layer structure having a lower layer of one the aforementioned materials with an overlying polycide layer.

15. The method of claim 9, wherein said nitride layer is comprised of a material selected from the group consisting of SiON, and SiN+SiON; said STIs are comprised of HDP-$SiO_2$; said gate dielectric layer is comprised of a material selected from the group consisting of $SiO_2$, $Ta_2O_5$, SiN, SiON, $SiO_2$+SiN, SiN+$SiO_2$, $HFO_2$ and $ZrO_2$; and said gate electrode is comprised of amorphous silicon.

16. A method of fabricating an air-gap spacer of a semiconductor device, comprising the steps of:
providing a semiconductor substrate having a pad oxide layer and a nitride layer successively formed on said substrate;

forming at least a pair of STIs through said nitride and pad oxide layers and into said substrate; said STIs defining an active region;

removing said nitride layer and pad oxide layer exposing said substrate at least within said active region; forming a gate electrode from about 1000 to 3000 Å thick on said exposed substrate within said active region; said gate electrode having an underlying gate dielectric layer; said gate dielectric layer being from about 10 to 75 Å thick;

forming a liner oxide layer from about 100 to 500 Å thick over the structure, covering the sidewalls of said gate dielectric layer, said gate electrode, and over the top surface of said gate electrode;

forming a liner nitride layer from about 50 to 300 Å thick over said liner oxide layer;

forming a thick oxide layer over the structure;

planarizing said thick oxide layer, said liner nitride layer, and said liner oxide layer level with said top surface of said gate electrode, and exposing said liner oxide layer at either side of said gate electrode;

removing said planarized thick oxide layer and a portion of said liner oxide layer and a portion of said gate dielectric layer from about 50 to 300 Å under said gate electrode to form a cross-section inverted T-shaped opening on at least one side of said gate electrode;

forming a gate spacer oxide layer over the structure at least as thick as said gate electrode, wherein said gate spacer oxide layer partially fills said inverted T-shaped opening from the top down; wherein air gap spacers are formed proximate the bottom of said inverted T-shaped opening; and etching said gate spacer oxide layer, liner nitride layer, and liner oxide layer to form gate spacers proximate said gate electrode; said gate spacers having an underlying etched liner nitride layer and liner oxide layer.

17. The method of claim 16, wherein said gate electrode is from about 1000 to 2500 Å thick, said gate dielectric layer is from about 14 to 20 Å thick, said liner oxide layer is from about 100 to 200 Å thick, said liner nitride layer is from about 50 to 200 Å thick; and said gate dielectric layer is removed from about 50 to 150 Å from under said gate electrode.

18. The method of claim 16, including the step of forming a patterned hard mask layer over said gate electrode, wherein said hard mask layer is used as a stop layer in said planarization step and said planarized thick oxide layer, liner nitride layer, and liner oxide layer are level with the top surface of said hard mask layer.

19. The method of claim 16, including the step of forming a patterned hard mask layer over said gate electrode, wherein said hard mask layer is comprised of a material selected from the group consisting of $Si_2N_4$, $SiO_2$, SiON, $SiO_2$+SiN, and $SiO_2$+SiON.

20. The method of claim 16, wherein said nitride layer is comprised of a material selected from the group consisting of SiON, and SiN+SiON; said STIs are comprised of a material selected from the group consisting of HDP-$SiO_2$, TEOS-LPCVD, and $O_3$ and TEOS (APCVD); said gate dielectric layer is comprised of a material selected from the group consisting of $SiO_2$, $Ta_2O_5$, SiN, SiON, $SiO_2$+SiN, SiN+$SiO_2$, $HFO_2$ and $ZrO_2$; and said gate electrode is comprised of a material selected from the group consisting of polysilicon, polycide, amorphous silicon, and a bi-layer structure having a lower layer of one the aforementioned materials with an overlying polycide layer.

21. The method of claim 16, wherein said nitride layer is comprised of a material selected from the group consisting of SiON, and SiN+SiON; said STIs are comprised of HDP-$SiO_2$; said gate dielectric layer is comprised of a material selected from the group consisting of $SiO_2$, $Ta_2O_5$, SiN, SiON, $SiO_2$+SiN, SiN+$SiO_2$, $HFO_2$ and $ZrO_2$; and said gate electrode is comprised of amorphous silicon.

* * * * *